US008627561B2

(12) United States Patent
Ovenshire

(10) Patent No.: US 8,627,561 B2
(45) Date of Patent: Jan. 14, 2014

(54) LAMP SOCKET ASSEMBLY TOOL

(75) Inventor: Jay H. Ovenshire, Macomb Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 13/408,119

(22) Filed: Feb. 29, 2012

(65) Prior Publication Data

US 2013/0219694 A1 Aug. 29, 2013

(51) Int. Cl.
*H05K 3/30* (2006.01)

(52) U.S. Cl.
USPC ................... 29/739; 29/758; 29/764; 29/278; 7/107

(58) Field of Classification Search
USPC ........ 29/729, 739, 747, 758, 764, 278; 294/2, 294/24, 99.2, 94; 7/107
See application file for complete search history.

(56) References Cited

U.S. PATENT DOCUMENTS 3,074,155 A * 1/1963 Hahn et al. ...................... 29/739
3,824,670 A * 7/1974 Clark .............................. 29/747
4,006,653 A * 2/1977 Kuntzsch .......................... 81/64
4,171,565 A * 10/1979 Boudreau et al. ............... 29/739
4,498,233 A * 2/1985 Simms ............................ 29/747
4,852,925 A * 8/1989 Lodin ............................... 294/2
5,161,301 A * 11/1992 Kilsdonk ........................ 29/739
5,177,846 A * 1/1993 Bryant ............................ 29/237
5,655,294 A * 8/1997 Makino ........................... 29/845
5,685,761 A * 11/1997 Schepens ........................ 445/63
6,363,560 B1 * 4/2002 Kesinger ........................... 7/107
6,401,571 B1 * 6/2002 Schuman ....................... 81/53.1
7,257,888 B2 * 8/2007 Nelson et al. ................... 29/764
7,644,494 B2 * 1/2010 Dinh ............................... 29/747

* cited by examiner

*Primary Examiner* — Minh Trinh
(74) *Attorney, Agent, or Firm* — Quinn Law Group, PLLC

(57) ABSTRACT

A lamp socket assembly tool includes an engaging end configured to engage a lamp socket inserted in an opening of a lamp housing, which may be a vehicle lamp housing. The tool includes a driving end operatively connected to the engaging end and configured to receive and transmit an axial and rotating force to the engaging end to assemble or disassembly a socket engaged by the tool relative to the housing. The tool includes a passage for receiving a connector portion of the socket such that the tool is not in contact with a connector interface. The passage may define an aperture through which a connector wire attached to the socket may exit or move freely during rotation of the socket by the tool. The engaging interface may substantially conform to a socket interface defined by a standardized filament lamp, such as an ECE H9 or H11 socket.

18 Claims, 2 Drawing Sheets

LAMP SOCKET ASSEMBLY TOOL

TECHNICAL FIELD

The present invention relates to a tool for the installation of a lamp socket to a lamp housing.

BACKGROUND

A vehicle lamp socket assembly may include a locking feature such as a locking tab and a compressible element configured for "push and turn" assembly of the lamp socket into a lamp housing opening configured to receive the socket. The lamp housing opening typically includes an unlocking feature such as a radial slot with a profile corresponding to the locking tab of the socket, and insertion of the socket into the housing opening requires alignment of the locking tab of the socket with the unlocking feature of the housing opening. In a typical assembly or installation sequence, the locking tab of the socket assembly is inserted through the housing opening with the locking tab aligned with the unlocking feature and with sufficient insertion force to compress the compressible element against the housing while rotating the socket axially in the opening until the locking tab no longer aligns with the unlocking feature and is in a position of interfering contact with the housing, e.g., until the socket is in a locked position. The compressive element, which may be configured, for example, as an o-ring or similar, provides a compressive force to retain the locking tab in contact with the lamp housing and in the locked position during operation of the lamp assembly.

The lamp socket may be removed from the lamp housing for vehicle maintenance such as a bulb replacement, by pushing the lamp socket into the housing with sufficient force to compress the compressible element to reduce the interfering contact with the housing, while rotating the socket until the locking tab is aligned with the unlocking feature of the opening, e.g., until the socket is in an unlocked position, then withdrawing the socket from the housing through the housing opening.

Installation of the socket to the housing and/or removal of the socket from the housing may typically be performed manually due to limited access resultant from packaging of the housing in the vehicle to ensure alignment and locking of the socket to the housing, and/or to prevent damage to the socket connector, socket terminals or wiring from contact or strain during installation or removal. Manual installation and/or removal of the lamp socket requires manual pinching, aligning and twisting finger motions to apply sufficient insertion and compression force and to rotate the socket with sufficient torque to lock and unlock the locking tab, which may be ergonomically challenging in some vehicle or lamp assembly configurations and assembly situations.

SUMMARY

An assembly tool for a vehicle lamp socket and a method for use are provided herein. The assembly tool is configured to provide an ergonomic advantage by eliminating manual pinching and twisting finger motions, and/or to provide a mechanical advantage for the application of compressive, axial and rotational forces to the socket relative to the lamp housing during installation of the vehicle lamp socket to a lamp housing and removal of the lamp socket from the housing. The tool is configured to prevent damage to the socket connector interface and/or connector components which may include wires, terminals, and/or connecting features. The tool may be configured to hold or position the socket during installation to increase ease of aligning a socket locking feature to a housing unlocking feature thereby decreasing installation time, or to exert a withdrawal force on the socket to remove the socket from the housing after unlocking. In one example, the tool includes an integral driver which may be configured as a T-handle. In another example, the tool defines a drive interface to which a driver may be selectively connected, which may facilitate tool access for installation and/or removal of the socket where manual access to the socket is limited by vehicle packaging, by adjacent vehicle components, etc. The tool may be made of any material suitable for transmitting sufficient axial force and rotating force (torque) to the socket to enable installation and removal of the lamp socket assembly relative to the lamp housing. For example, the tool may be made of a metallic material, a non-metallic material such as a polymer-based material, or a combination of these.

The lamp socket assembly tool, referred to herein as the tool, includes an engaging end configured to engage a lamp socket inserted in a housing opening. The housing opening is defined by a lamp housing, which may be a lamp housing in a vehicle. The vehicle lamp housing may be configured to house, for example, a headlamp socket assembly, a tail lamp socket assembly, a turn indicator lamp socket assembly, or a license plate lamp socket assembly. The tool includes a driving end operatively connected to the engaging end and configured to receive and transmit an axial force and a rotating force to the engaging end. The tool further includes a passage in communication with the engaging end and configured to receive a connector portion of the socket. The tool in use engages the socket to transmit the axial force and the rotating force to the lamp socket to axially displace the lamp socket relative to the lamp housing while rotating the lamp socket relative to the housing opening from one of a locked and unlocked position to the other of a locked and unlocked position relative to the lamp housing.

Axially displacing the lamp socket relative to the lamp housing may include using the tool to exert the axial force on a compressible element interposed between the lamp socket and the lamp housing to compress the compressible element to reduce the rotating force required to rotate the lamp socket relative to the housing opening. The compressible element may be configured as a seal to preventingression of contaminants into the lamp housing when the socket is in an installed and locked position.

The tool passage may define an aperture in communication with an external surface of the tool. The lamp socket may include a connector wire having a first end and a second end. The first end of the connector wire may be operatively connected to the connector portion. The tool in use may engage the lamp socket such that the first end of the connector wire is contained in the passage and the second end of the connector wire extends through the aperture such that the second end of the connector wire is external to the tool and may move freely relative to the tool during rotation of the socket by the tool.

The engaging end of the tool may define an engaging interface configured to substantially conform to a socket interface defined by the lamp socket, such that the tool in use transmits the axial force and the rotating force through the engaging interface to the socket interface. The engaging end may be configured to engage the lamp socket such that the tool in use can receive the lamp socket and align and insert the lamp socket into the housing opening. Aligning and inserting the lamp socket into the housing opening may include the tool in use applying a rotating force to the lamp socket to align a locking feature defined by the lamp socket with an unlocking feature defined by the lamp housing. The engaging end may be configured to engage the lamp socket such that the tool in use can apply an axial force to the lamp socket to remove the lamp socket from the lamp housing when the lamp socket is in the unlocked position. In one example, the engaging interface may be configured to substantially conform to a socket interface defined by a standard vehicle lamp socket, or a standardized filament lamp as defined in Regulation N. 37 of UNECE Vehicle Regulations, which may be, but is not limited to, one of a H9 or H11 socket.

The tool may include a driver operatively connected to the driving end and configured to transmit the axial force and the rotating force to the driving end. The driving end of the tool may define a driven interface configured to receive the driver, and the driver may be configured to be selectively connected to the driven interface to transmit the axial force and the rotating force to the driving end. The driven interface of the tool may define a polygonal surface, which may be, for example, a square surface or hexagonal surface, and the driver may be configured to be in operative contact with the polygonal surface when the driver is selectively connected to the driven interface.

A method for assembling a lamp socket assembly to a lamp housing of a vehicle includes providing a lamp socket assembly including a compressible element and a socket defining a socket interface, engaging an engaging interface of a lamp socket assembly tool to the socket interface, aligning the socket assembly in an unlocked position relative to the lamp housing the tool, applying an axial force to the driving end of the tool to insert the socket assembly into the lamp housing and compress the compressible element, and applying a rotating force to the driving end of the tool while applying the axial force to rotate the socket assembly in a first direction to a locked position relative to the lamp housing. The method may include operatively connecting a driver to the driving end of the tool, and applying the axial force and the rotating force to the driving end of the tool using the driver.

The above features and other features and advantages of the present invention are readily apparent from the following detailed description of the best modes for carrying out the invention when taken in connection with the accompanying drawings.

DETAILED DESCRIPTION

Figure 1:
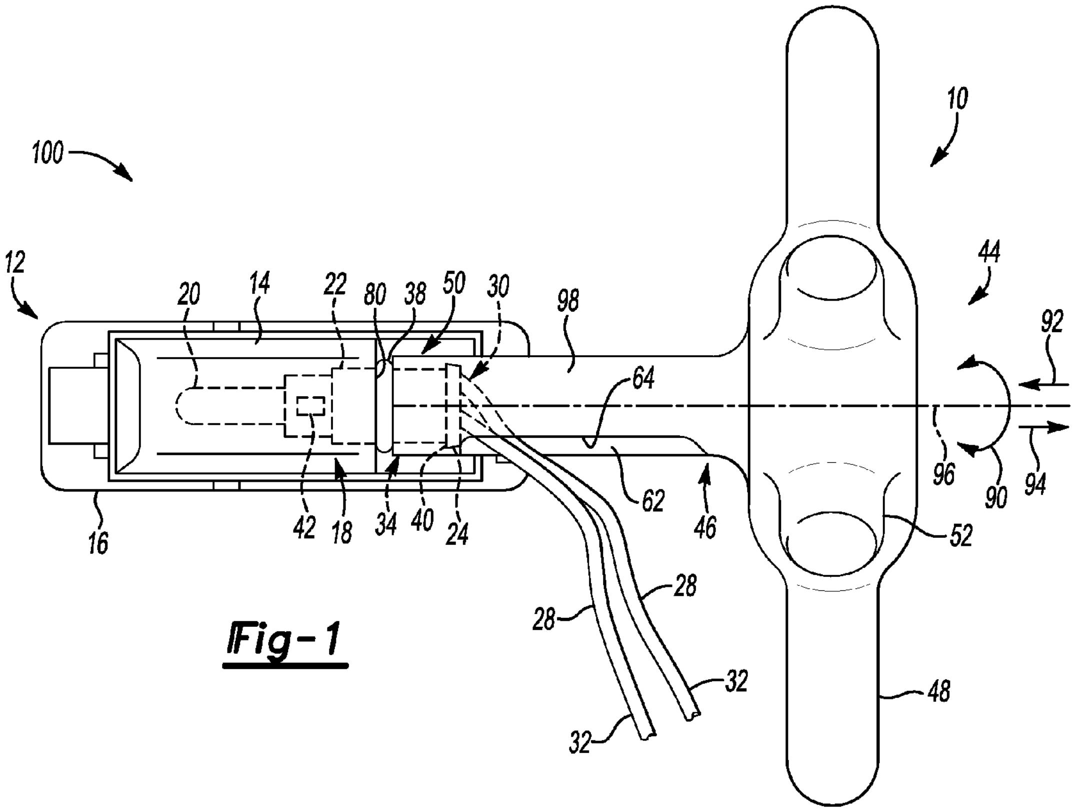
FIG. 1 is a top plan schematic view of a lamp socket assembly tool in operative contact with a lamp socket of a lamp assembly.

Referring to the drawings wherein like reference numbers represent like components throughout the several figures, the elements shown in FIGS. 1-5 are not necessarily to scale or proportion. Accordingly, the particular dimensions and applications provided in the drawings presented herein are not to be considered limiting. A lamp socket assembly tool and a method of using the socket assembly tool are provided herein. Referring to FIG. 1, shown is a top plan schematic view of a lamp socket assembly tool generally indicated at 10, and positioned in contact with the lamp assembly generally indicated at 12. The lamp socket assembly tool 10, which may be referred to herein as the tool, may be configured for use in assembling a lamp socket assembly generally indicated at 18 to a lamp housing 14 to form the lamp assembly 12. The lamp assembly 12 including the lamp socket assembly 18 and the lamp housing 14 may be components of a vehicle generally indicated at 100. A method described herein may be used in the assembly or servicing of the lamp assembly 12, installation of the socket assembly 18 into the lamp housing 14, and/or removal and reinstallation of the socket assembly 18, for example, to replace a lamp bulb 20 of the socket assembly 18.

The lamp assembly 12 includes a lamp housing 14 operatively connected to a lens plate 16. The lens plate 16 may be a lens plate of the vehicle 100 and may include an opening and/or lens (not shown) through which light from the bulb 20 may be emitted from the vehicle 100. By way of non-limiting example, the lamp assembly 12 may be configured as one of a license plate lamp, tail lamp, head lamp, turn indicator lamp, or other lamp configured for use on the vehicle 100. In the example shown in FIGS. 1 and 3, the lamp assembly 18 is configured as a license plate lamp assembly. The socket assembly 18 is shown inserted into the housing 14 and may include a socket 22, a lamp bulb 20, and a compressible element 38. The housing 14 includes an opening 80 configured to receive the socket assembly 18. The housing 14 and/or housing opening 80 may include an unlocking feature (not shown) such as a radial slot with a profile corresponding to a locking feature 42 defined by the socket 22, such that insertion of the socket 22 into the housing 14 requires alignment of the socket locking feature 42 with the unlocking feature of the housing 14.

Figure 3:
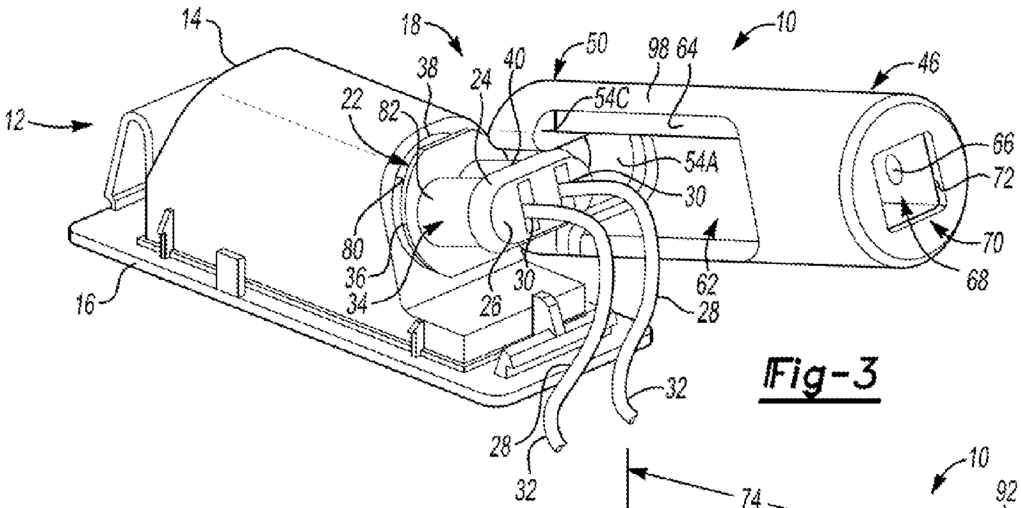
FIG. 3 is an schematic perspective exploded side view of the lamp socket assembly tool and the lamp assembly of FIG. 1.

The socket 22 is configured to receive the lamp bulb 20 and includes a connector portion 24. The connector portion 24 includes a connector interface 26 to which a power supply (not shown) may be electrically connected to power the lamp bulb 20. The connector interface 26 may be of any suitable type, and may include one or more terminals for connection to the power supply. In a first example shown in FIGS. 1 and 3, the connector portion 24 includes at least one connector wire 28. Each of the connector wires 28 have a first end 30 and a second end 32. The first end 30 is operatively connected to the socket 22 through the connector interface 26. The second end 32 of the connector wires 28 may be connected, for example, to a switch or power supply to provide power to the socket assembly 18 including the lamp bulb 20. The connector wires 28 may be of sufficient length to connect the socket 22 to the power supply and/or to allow removal of the socket 22 from the housing 14, for example, to replace the bulb 20 or otherwise service the portion of the vehicle including the lamp assembly 12. The example shown in FIGS. 1 and 3 is not intended to be limiting. For example, the socket assembly 18 may be configured with a wire harness or loom including at least one wire 28. The second end 32 may be attached to another connector (not shown) for connection to a power source. By way of non-limiting example, the connector interface 26 may include another configuration of terminal, such as a blade or pin terminal.

The socket 22 includes a flange 36. The socket 22 may include a shoulder 40 which may be defined by the connector portion 24. A socket interface 34 which is engaged by an engaging end 50 of the tool 10 when the tool 10 is in use is defined by the socket 22 and includes, as shown in FIGS. 1 and 3, the generally oval cylindrical portion 82 between the flange 36 and the shoulder 40. The socket interface 34 may include portions of the flange 36 and the shoulder 40 adjacent to the cylindrical portion 82 which may be in contact with the engaging end 50 of the tool 10 in use.

The socket 22 may include a locking feature 42, which may be a locking tab configured to be in contact with and/or interfere with a portion of the housing 14 when the socket 22 is installed in the housing 14 in a locked position. The locking tab 42 may be configured to pass through an unlocking feature configured as a corresponding opening (not shown) in the housing 14 when the socket 22 is in an unlocked position and to allow insertion of the socket 22 into the housing 14. After inserting the socket 22 into the housing 14 with the socket locking feature 42 and the housing unlocking feature aligned, e.g, with the socket 22 in the unlocked position, and the locking feature 42 within the housing 14, the socket 22 may be rotated about an axis 96 such that the locking feature 42 is no longer aligned with the unlocking feature and is in interfering contact with a portion of the housing 14, e.g., the socket 22 is in a locked position. When the socket 22 is in the locked position, the socket 22 resists removal from the housing 14 due to interference between the locking feature 42 and the housing 14. Removal of the socket 22 requires rotation of the socket 22 to align the locking feature 42 with the housing unlocking feature prior to withdrawing the socket 22 from the housing 14, e.g., pulling the socket 22 through the housing opening 80 and out of the housing 14.

The compressible element 38 may be positioned relative to the socket 22 such that the compressible element 38 is interposed between the socket 22 and the housing 14. In the example shown, the compressible element 38 is configured as a cylindrical seal, which may be an o-ring assembled onto the socket 22 adjacent to the socket flange 36. The compressible element 38 may be made of a rubber-based material, polymer-based material, elastic material or otherwise compressible material. The compressible element 38 may be configured to resist insertion of the socket 22 into the housing 14, and compression of the compressible element 38 may be required to insert the socket 22 to a depth required to position the locking feature 42 sufficiently inside the housing 14 to allow rotation of the socket 22 relative to the housing opening 80 to position the locking feature in interfering contact with the housing 14, e.g., to position the socket in a locked position. Compression of the compressible element 38 may be achieved by exerting an axial force 92 on the compressible element 38 in the direction of the housing 14. The axial force 92 may be applied to the compressible element 38 by transmitting the axial force 92 through the tool 10 in contact with the socket flange 36, to compress the compressible element 38 between the flange 36 and the housing 14. When the axial force 92 is removed, the compressible element 38 exerts an elastic force between the socket flange 36 and the housing 14 to retain the locking feature 42 in interfering contact with the housing 14, thereby retaining the socket 22 in the locked position in the housing 14. The compressible element 38 may be configured as a seal to preventingression of contaminants into the lamp housing 14 when the socket 22 is in the installed and locked position.

Compression of the compressible element 38 may be required to unlock and remove the socket 22 from the housing 14. Compressing the compressible element 38 by applying an axial force 92 may be required to axially displace the socket 22 further into the housing 14 to reduce or eliminate the interfering contact between the locking feature 42 and the housing 14 when the socket 22 is in a locked position, to allow rotation of the socket 22 to the unlocked position. By reducing the interfering contact between the locking feature 42 and the housing 14, the rotating force (torque) 90 required to rotate the socket 22 is reduced, enabling rotation of the socket 22 to align the locking feature 42 with the unlocking feature of the housing 14 such that the socket 22 can be removed from the housing 14 by applying an axial force 94 away from the housing. The axial force 94 may be applied to the socket 22 by transmitting the axial force 94 through the tool 10 in contact with a shoulder 40 defined by the socket 22.

Figure 2:
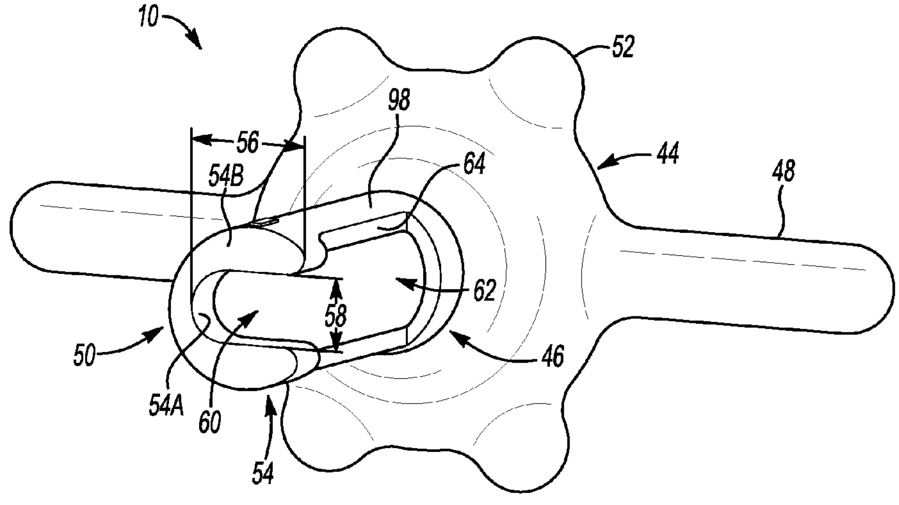
FIG. 2 is a schematic perspective view of the lamp socket assembly tool of FIG. 1 in a first example configuration.

As shown in FIGS. 1-3, the tool 10 includes a driving end 46 operatively connected to the engaging end 50 and configured to receive and transmit an axial force 92, 94 and a rotating force 90 to the engaging end 50. The tool 10 may further include a passage 62 in communication with the engaging end 50 and configured to receive the connector portion 24 of the socket 22. The tool 10 in use is configured to engage the socket 22 to transmit the axial force in a first direction 92 toward the housing 14, and to transmit the rotating force 90 to the lamp socket 22 to axially displace the lamp socket 22 relative to the lamp housing 14 while rotating the lamp socket 22 relative to the housing opening 80 from one of a locked and unlocked position to the other of a locked and unlocked position relative to the lamp housing 14. Axially displacing the lamp socket 22 relative to the lamp housing 14 may include using the tool 10 to exert the axial force 92 on the compressible element 38 interposed between the lamp socket 22 and the lamp housing 14, to compress the compressible element 38 to reduce the rotating force 90 required to rotate the lamp socket 22 relative to the housing opening 80.

The tool passage 62 may define an aperture 64 in communication with an external surface 98 of the tool 10. The passage 62 and the aperture 64 may be configured such that the connector interface 26 and/or the first ends 30 of the connector wires 28 attached to the socket 22 are contained in the passage 62, and the second ends 32 of the connector wires 28 extend through the aperture 64 and are external to the tool 10 when the tool 10 in use engages the lamp socket 10. The connector wires 28 extending through the aperture 64 may move freely relative to the tool 10 during application of axial and/or rotating forces 90, 92, 94 to the socket assembly 18 by the tool 10, such that the connector wires 28 are not strained or damaged during installation and/or removal of the socket assembly 18 relative to the housing 14. The passage 62 contains and/or at least partially surrounds the connector interface 26 and the first ends 30 of the connector wires 28 such that the connector interface 26 and the first ends 30 are not contacted by the tool 10 in use, preventing damage to and/or stressing of the interface 26 and the first ends 30 of the wires 28 during installation and/or removal of the socket assembly 18 relative to the housing 14.

The engaging end 50 of the tool 10 may define an engaging interface generally indicated at 54 and configured to substantially conform to the socket interface 34, such that the tool 10 applied to the socket 22 and/or rotated about an axis 96 may be used to transmit one or more axial forces 92, 94 and a rotating force 90 through the engaging interface 54 to the socket interface 34. The engaging end 50 may define a recess 60 configured to engage the lamp socket 22 such that the tool 10 in use can receive the lamp socket 22 and align and insert the lamp socket 22 into the housing opening 80. In the example shown in FIGS. 1-3, the engaging interface 54 of the tool 10 may include one or more of the interface portions 54A, 54B, and 54C. The engaging recess 60 may be defined by one or more of the engaging interface portions 54A, 54B, and 54C. The interface portion 54A substantially defines the recess 60 and is configured such that the tool 10 in use, e.g., engaged with the socket 22, may transmit a rotating force 90 through the interface portion 54A to the socket 22. The interface portion 54B may be generally defined by the end face of the engaging end 50 of the tool 10 and is configured such that the tool 10 in use, e.g., engaged with the socket 22, may transmit an axial force 92 through the interface portion 54B to the socket 22. The interface portion 54C is generally defined by a step or shoulder separating the recess 60 from the passage 62 and is configured such that the tool 10 in use, e.g., engaged with the socket 22, may transmit an axial force 94 through the interface portion 54C to the socket 22.

In the example shown in FIGS. 1-3, the engaging interface 54 and the recess 60 are configured to substantially conform to the socket interface 34, where the socket interface 34 is defined by the cylindrical interface portion 82 and the surfaces of the flange 36 and the shoulder 40 adjacent to the interface portion 82. As shown in FIG. 2, the engaging interface 54 and/or the recess 60 may be characterized by a first dimension 56 and a second dimension 58. The generally oval cylindrical socket interface portion 82 may be defined by dimensions corresponding to the dimensions 56, 58 such that the oval cylindrical portion 82 substantially conforms to, e.g., is in generally conforming contact with the interface surface 54A. As used herein, the terms "substantially conforms to" and "generally conforming contact" indicate a majority of a socket interface portion or surface thereof is in contact with a corresponding engaging interface portion or surface thereof, and/or a majority of an engaging interface portion or surface thereof is in contact with a corresponding socket interface portion or surface thereof, when the tool 10 is in use, e.g., when the engaging end 50 is engaged with the socket 10 and/or a force is being transmitted through the tool 10 to the socket 10.

For example, as shown in FIGS. 1-3, a majority of the engaging interface portion 54A is in contact with the generally cylindrical portion 82 when the engaging end 50 is engaged with the socket 22, such that a rotating force 90 received by the tool 10 in use may be transmitted through the interface portion 54A to the socket interface portion 34, to rotate the socket 22. The majority of the engaging interface portion 54B is in contact with the socket interface surface of the flange 36 adjacent the generally cylindrical portion 82 when the engaging end 50 is engaged with the socket 22, such that an axial force 92 received by the tool 10 in use may be transmitted through the interface portion 54B to the flange 36, to apply the axial force 92 to insert the socket 22 into the housing 14 and/or to compress the compressible element 38 between the flange 36 and the housing 14. The majority of the engaging interface portion 54C is in contact with the socket interface surface of the shoulder 40 adjacent the socket interface portion 34 when the engaging end 50 is engaged with the socket 22, such that an axial force 94 received by the tool 10 in use may be transmitted through the interface portion 54C to the shoulder 40, to apply the axial force 94 to withdraw or remove the socket 22 from the housing 14.

The recess 60 and the engaging interface 54 may define a standard interface or a non-standard interface. As used herein, the term "standard" refers to an interface or configuration which conforms with a standard defined by an industrial, government or other generally recognized authoritative reference, including, for example, standards defined or promulgated by the International Standards Organization (ISO), the Society of Automotive Engineers (SAE), the American Society for Testing and Materials (ASTM), the German Institute for Standardization (DIN), the United Nations Economic Commission for Europe (ECE), and similar. Referring to the example shown in FIGS. 1-3, the engaging interface 54 and the recess 60 may be a non-standard configuration, for example, in contrast to a standard tool opening of a standard open-ended wrench, where the dimensions 56, 58 individually or in combination define a non-standard opening. In the example shown in FIGS. 4-5, the engaging recess 60 and/or the engaging interface may be a standard engaging interface configured to substantially conform to the socket interface 34, where in the example shown, the socket 22 may be one of a standard ECE H9 or H11 type lamp socket.

The tool 10 may include a driver 44 operatively connected to the driving end 46 and configured to receive and transmit one or more of the axial forces 92, 94 and the rotating force 90 to the driving end 46. The driver 44 may be integral to the tool 10, e.g., permanently connected to or integrally formed as part of the tool 10, as shown in the example of FIGS. 1-2, or may be configured as a separate driver element (not shown) selectively attachable to the tool 10. The driver 44 may be of any suitable configuration to receive and transmit axial and/or rotating force to the tool 10 and/or driving end 46. In the example shown in FIGS. 1-2, the driver 44 may be generally configured as a handle. The driver 44 may include one or more features to provide ergonomic advantage and/or to reduce ergonomic strain including finger strain when using the tool 10 to install and/or remove the socket assembly 18 relative to the housing 14. For example, the driver 44 may be configured for use as a T-handle, by including an integrated T-handle member 48 in the tool 10, or by the tool 10 defining a receiving feature (not shown) for receiving a driver 44 including a T-handle member 48. In another example, the driver 44 may include one or more gripping features 52. The T-handle member 48 and/or the gripping features 52 may provide an ergonomic advantage when using the tool 10, by reducing the manual input or strain required to apply one or more of the axial and rotating forces 90, 92, 94 to the socket 22, by providing a larger gripping surface thereby reducing finger strain and pinching motions during installation/removal of the socket 22, and/or by providing a stabilizing interface to prevent tool slippage of the tool 10 in use.

Figure 4:
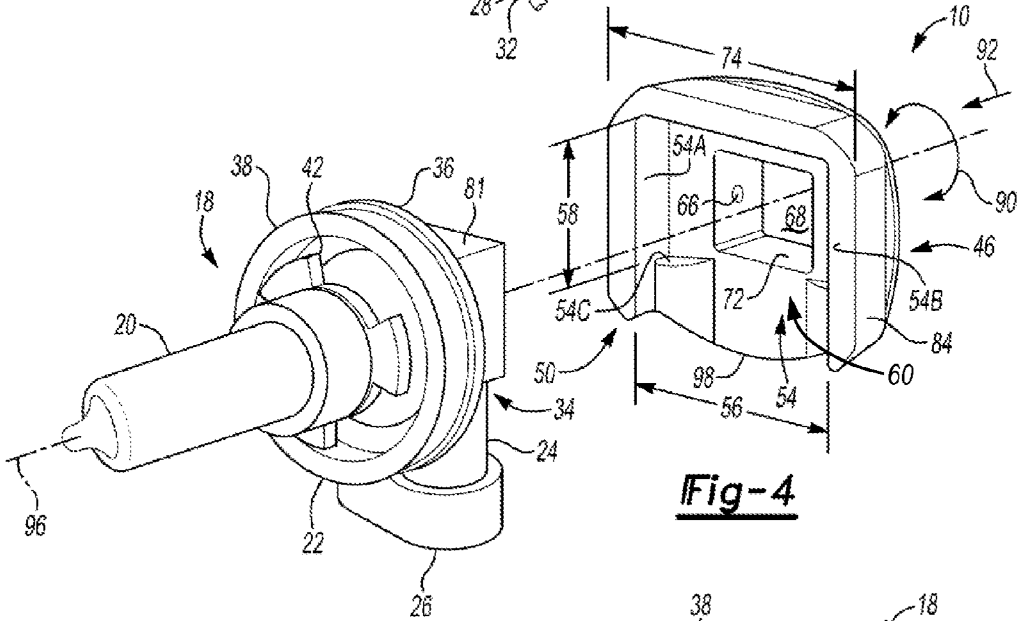
FIG. 4 is a schematic perspective exploded view of one side of a lamp socket assembly tool and lamp socket assembly in a second example configuration.
Figure 5:
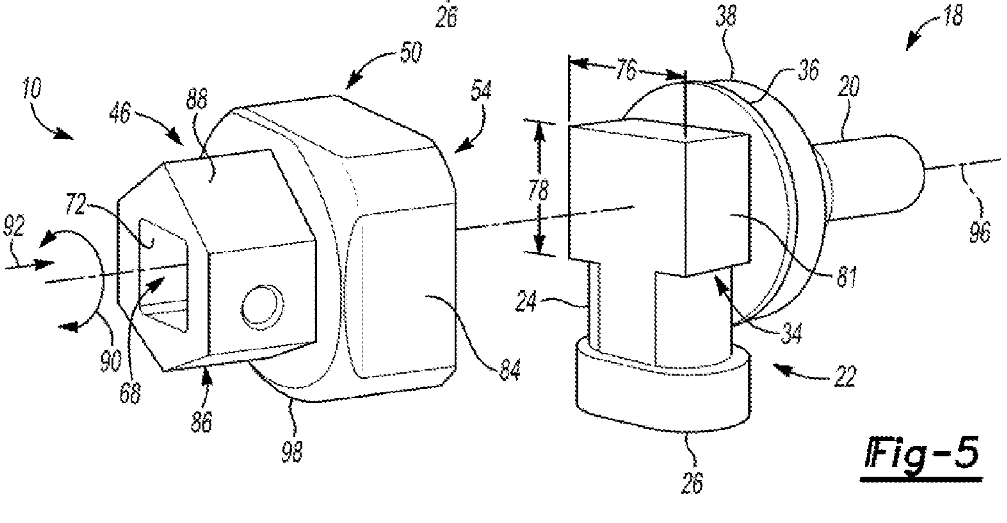
FIG. 5 is schematic perspective exploded view of the other side of the lamp socket assembly tool and lamp socket assembly of FIG. 4.

The tool 10 and/or the driving end 46 may define a driven interface 70 configured to receive the driver 44, and the driver 44 may be configured to be selectively connected to the driven interface 70 to transmit the axial force and the rotating force to the driving end 46 and/or the tool 10. The driven interface 70 of the tool 10 may define a driven interface surface 72 and/or a recess 68 for receiving the driver 44. The driver 44 may include a drive (not shown) configured to be selectively connected to the driven interface 70. In one example, the driven interface surface 72 may be configured as a polygonal surface, as shown in the examples of FIGS. 3-5. The driver 44 may include a drive defining a corresponding polygonal surface, such that the drive of the driver 44 may be selectively fitted to, e.g., operatively attached or connected to the driven interface surface 72 to transmit a force from the driver 44 to the tool 10. In the example shown in FIG. 3, the driven interface surface 72 may be configured as a generally square surface which may define a detent 66, such that the driven interface 70 is configured to receive a standard box drive of the type incorporated into a ratchet wrench, a socket wrench, a torque wrench, or similar, where the wrench can be used as the driver 44 such that the wrench 44 selectively connected to the tool 10 can be used to transmit a force through the tool 10 to the socket 22.

The driving end 46 of the tool 10 shown in FIG. 3 may be configured to define a driven interface 70 including a hexagonal surface, for example, the surface 88 shown in FIG. 5, such that the driving end 46 and the tool 10 may be driven by a driver 44 selectively attached to the hexagonal surface 88. In this instance, the driver 44 may include a drive having a driving surface compatible with or corresponding to the hexagonal surface 88. For example, the driver 44 may be a wrench (not shown), such as a socket wrench or open ended wrench corresponding to the hexagonal driven interface surface 88, such that the driver/wrench 44 may be selectively connected to the driving end 46 of the tool 10 to transmit an axial and/or rotating force 90, 92, 94 through the tool 10 to the socket 22.

The driving end 46 of the tool 10 shown in FIG. 3 may be configured to define a driven interface 70 including generally parallel surfaces, such that the driving end 46 and the tool 10 may be driven by a driver 44 selectively attached to the parallel surfaces, where the driver 44 may include a drive having a driving surface compatible with or corresponding to the parallel surfaces. The parallel surfaces may be configured, for example, as the surfaces 84 shown in FIGS. 4-5 which may be characterized by a dimension 74. In another example, the parallel surfaces may be defined by the parallel sides of the hexagonal surface 88 shown in FIG. 5. The driver 44 including a driving surface adaptable to the parallel surfaces may be, for example, a wrench (not shown), such as open ended wrench, a pair of pliers, an adjustable wrench or similar tool including generally parallel or otherwise corresponding surfaces corresponding to the parallel driven interface surfaces 84 and corresponding dimension 74, or the parallel sides of the hexagonal surface 88, such that the driver/wrench 44 may be selectively connected to the driving end 46 of the tool 10 to transmit an axial and/or rotating force 90, 92, 94 through the tool 10 to the socket 22.

As shown in FIGS. 4-5, the tool 10 and the driven interface 70 may include more than one driven interface surface, such that a plurality of different tools may be selectively attached to the tool 10 to transmit a force to the socket 22, to provide flexibility in use of the tool 10. For example and as shown in FIGS. 4-5, the driven interface 70 may include a first driven interface surface 72, a second driven interface surface 88, and a third driven interface surface 84. The examples shown in FIGS. 1-5 are intended to be non-limiting. For example, the tool 10 shown in FIGS. 1-3 may incorporate one or more of the driven interface surfaces 72, 84, 88, or another driven interface surface not shown which may be compatible with an attachable driver 44, where the attachable driver 44 may be configured as either of a standard or non-standard driver capable of applying and/or transmitting an axial and/or rotating force 90, 92, 94 to the tool 10. The integral handle 44 shown in FIGS. 1-2 may be applied to the tool 10 shown in FIGS. 4-5. The overall axial length of the tool 10 may be modified such that the tool may be fitted to the socket 22 within the packaging constraints or requirements of the lamp assembly 12 including the socket 22 and to allow for application of the tool 10 to the socket 22 in use.

The second example configuration of the socket assembly tool 10 shown in FIGS. 4-5 may include a driven interface 70 defining one or more driven interface surfaces 72, 84, 88, as previously described, and may include an engaging end 50. The socket 22 shown in the socket assembly 18 of FIGS. 4-5 may be configured as a standard socket, which may be an ECE type H9 or H11 socket 22. The H9 or H11 socket 22 may be incorporated in a lamp assembly 12 configured for use, for example, in a headlamp or tail lamp assembly of the vehicle 100. The engaging end 50 may be configured to conform to a standard socket, such as the socket 22 shown in FIGS. 4-5, by defining a standard engaging interface 54 and/or a standard engaging recess 60, e.g., one substantially conforming to a standard socket interface 34. The socket assembly 18 shown in FIGS. 4-5 includes a socket 22, a bulb 20, and a compressible element 38. The socket 22 is configured to receive the lamp bulb 20 and includes a socket interface 34, a flange 36 adjacent the socket interface 34, and a connector portion 24. The connector portion 24 includes a connector interface 26 to which a power supply (not shown) may be electrically connected to power the lamp bulb 20. The connector interface 26 may be configured as a standard H9/H11 interface to include at least one blade terminal (not shown).

The socket interface 34 which is engaged by an engaging end 50 of the tool 10 when the tool 10 is in use is defined by the socket 22 and may include, as shown in FIGS. 4-5, the generally rectangular portion 81. The generally rectangular portion 81 may be characterized by a first socket interface dimension 76 corresponding to a first engaging interface dimension 56, and may be further characterized by a second socket interface dimension 78 corresponding to a second engaging interface dimension 58. The socket interface 34 may include portions of the flange 36 and the connector portion 24 adjacent to the rectangular portion 81 which may be in contact with the engaging end 50 of the tool 10 in use.

The socket 22 may include one or more locking features 42. As shown in FIG. 4, the locking feature 42 may be a locking tab configured to be in contact with and/or interfere with a portion of the housing 14 when the socket 22 is installed in the housing 14 in a locked position. The locking tab 42 may be configured to pass through an unlocking feature in the housing 14 when the socket 22 is in an unlocked position and to allow insertion of the socket 22 into the housing 14. The unlocking feature, as previously described may be a corresponding opening (not shown) defined by the housing opening 80. After inserting the socket 22 into the housing 14 with the socket locking feature 42 and the housing unlocking feature aligned, the socket 22 may be axially rotated such that the locking feature 42 is in interfering contact with a portion of the housing 14, e.g., the socket 22 is in a locked position. When the socket 22 is in the locked position, the socket 22 resists removal from the housing 14 due to interference between the locking feature 42 and the housing 14. Removal of the socket 22 requires rotation of the socket 22 to align the locking feature 42 with the housing unlocking feature prior to withdrawing the socket 22 from the housing 14, e.g., pulling the socket 22 through the housing opening 80 and out of the housing 14.

As described for FIGS. 1-3, the compressible element 38 shown in FIGS. 4-5 may be positioned relative to the socket 22 such that the compressible element 38 is interposed between the socket 22 and the housing 14, and may be configured to resist insertion of the socket 22 into the housing 14. Compression of the compressible element 38 may be required to insert the socket 22 to a depth required to position the locking feature 42 sufficiently inside the housing 14 to allow rotation of the socket 22 relative to the housing opening 80 to position the locking feature in interfering contact with the housing 14, e.g., to position the socket in a locked position. Compression of the compressible element 38 may be achieved by exerting an axial force 92 on the compressible element 38 in the direction of the housing 14. The axial force 92 may be applied to the compressible element 38 by transmitting the axial force 92 through the tool 10 in contact with the socket flange 36, to compress the compressible element 38 between the flange 36 and the housing 14. When the axial force 92 is removed, the compressible element 38 exerts an elastic force between the socket flange 36 and the housing 14 to retain the locking feature 42 in interfering contact with the housing 14, thereby retaining the socket 22 in the locked position in the housing 14.

Compression of the compressible element 38 may be required to unlock and remove the socket 22 from the housing 22. Compressing the compressible element 38 by applying an axial force 92 may be required to axially displace the socket 22 further into the housing 14 to reduce or eliminate the interfering contact between the locking feature 42 and the housing 14 when the socket 22 is in a locked position, to allow rotation of the socket 22 to the unlocked position. By reducing the interfering contact between the locking feature 42 and the housing 14, the rotating force (torque) 90 required to rotate the socket 22 is reduced, enabling rotation of the socket 22 to align the locking feature 42 with the unlocking feature of the housing 14 such that the socket 22 can be removed from the housing 14.

As shown in FIGS. 4-5, the tool 10 includes a driving end 46 operatively connected to the engaging end 50 and configured to receive and transmit an axial force 92 and a rotating force 90 to the engaging end 50. The tool 10 further includes a passage 62 in communication with the engaging end 50 and configured to receive the connector portion 24 of the socket 22. The tool 10 in use is configured to engage the socket 22 to transmit the axial force 92 toward the housing 14, and to transmit the rotating force 90 to the lamp socket 22 to axially displace the lamp socket 22 relative to the lamp housing 14 while rotating the lamp socket 22 relative to the housing opening 80 from one of a locked and unlocked position to the other of a locked and unlocked position relative to the lamp housing 14. Axially displacing the lamp socket 22 relative to the lamp housing 14 may include using the tool 10 to exert the axial force 92 on the compressible element 38 interposed between the lamp socket 22 and the lamp housing 14, to compress the compressible element 38 to reduce the rotating force 90 required to rotate the lamp socket 22 relative to the housing opening 80.

The tool passage 62 may define an aperture 64 in communication with an external surface 98 of the tool 10. The passage 62 and the aperture 64 may be configured such that the connector portion 24 is received by and extends through the passage 62, such that the passage 62 at least partially surrounds the connector portion 24 and the connector interface 26 and terminals contained therein are not contacted by the tool 10 in use, preventing damage to and/or stressing of the interface 26 and the connector terminals during installation and/or removal of the socket assembly 18 relative to the housing 14.

The engaging end 50 of the tool 10 may define an engaging interface generally indicated at 54 and configured to substantially conform to the socket interface 34, such that the tool 10 may be used to transmit an axial force 92 and a rotating force 90 through the engaging interface 54 to the socket interface 34. The engaging end 50 may define a recess 60 configured to engage the lamp socket 22 such that the tool 10 in use can receive the lamp socket 22 and align and insert the lamp socket 22 into the housing opening 80. In the example shown in FIGS. 4-5, the engaging interface 54 of the tool 10 may include one or more of the interface portions 54A, 54B, and 54C. The engaging recess 60 may be defined by one or more of the engaging interface portions 54A, 54B, and 54C. The interface portion 54A substantially defines the recess 60 and is configured such that the tool 10 in use, e.g., engaged with the socket 22, may transmit a rotating force 90 through the interface portion 54A to the socket 22. The interface portion 54B may be generally defined by the end face of the engaging end 50 of the tool 10 and is configured such that the tool 10 in use, e.g., engaged with the socket 22, may transmit an axial force 92 through the interface portion 54B to the socket 22. The interface portion 54C is generally defined by a step or shoulder separating the recess 60 from the passage 62 and is configured such that the tool 10 in use, e.g., engaged with the socket 22, may engage the socket interface 34 to prevent slippage of the tool 10 in use and relative to the socket 22.

The tool 10 may be configured of any material suitable to interface with the socket 22 and to receive, transmit and apply the axial and rotating forces 90, 92, 94. The tool 10 may be made of a metallic material, a non-metallic material such as a polymer-based material, or a combination thereof. By way of example, the tool 10 may be made of polymer which may be formed by injection molding which may be reinforced or include a filler material or insert for added strength and/or durability. The tool 10 may include, for example, a thermoset material, a thermoplastic material, a polyester, a polyamide, polybutylene perephthalate (PBT), nylon 6,6, glass reinforced nylon 6,6, or a combination of these.

The driver 44 may be configured of the same material as the tool 10, or may be another material. For example, the driver 44 may be of the same material as the tool 10 when the driver 44 is incorporated into the tool 10, such as a molded polymer material, for ease of manufacturing the tool 10 including the driver 44, by molding or otherwise. The driver 44 configured as a separate component and selectively attachable to the tool 10 may be configured of another material, which may be a material typically used to manufacture the driver 44 when the driver 44 is a standardized driver, such as a wrench, which may be a metallic material formed by casting, stamping, machining, heat treating, and/or a combination of these. One or both of the driver 44 and tool 10 may be configured as disposable tools which may be provided, for example, in a replacement service kit for performing maintenance and/or service operations relative to the lamp assembly 12, and the disposable tool 10 and/or driver 44 may be configured, in terms of material selection, durability, etc., for use for a limited or minimal number of times, which may be, for example, a disassembly and reinstallation sequence required to replace the bulb 20 in the lamp assembly 12.

A method for assembling the lamp socket assembly 18 to the lamp housing 14 of a vehicle 100 includes providing the lamp socket assembly 18 including the compressible element 38 and the socket 22 defining a socket interface 34, engaging the engaging end 50 and/or the engaging interface 54 of the lamp socket assembly tool 10 to the socket 22 and/or socket interface 34, aligning the socket assembly 18 in an unlocked position relative to the lamp housing 14 using the tool 10, applying an axial force 92 to the driving end 46 of the tool 10 to insert the socket assembly 18 into the lamp housing 14 and to compress the compressible element 38. The method further includes applying a rotating force 90 to the driving end 46 of the tool 10 while applying the axial force 92 to rotate the socket assembly 18 in a first direction to a locked position relative to the lamp housing 14 and using the tool 10.

The method may further include engaging the engaging end 50 and/or the engaging interface 54 of the lamp socket assembly tool 10 to the socket 22 and/or socket interface 34 when the socket assembly 18 is in a locked position relative to the lamp housing 14 using the tool 10, applying an axial force 92 to the driving end 46 of the tool 10 to compress the compressible element 38 while applying a rotating force 90 to the driving end 46 of the tool to align the socket assembly 18 in an unlocked position relative to the lamp housing 14, and removing the socket assembly 18 through the housing opening 80 and from the housing 14. Removing the socket assembly 18 from the housing 14 may include exerting an axial force 94 on the socket 22 using the tool 10 to remove the socket 22 from the housing 14.

The tool 10 may be configured such that the connector interface 26 of the socket 22, and/or the terminal ends such as wire ends 30 or blade terminals contained therein are not contacted by the tool 10 in use. The tool 10 may be configured such that connector wires 28 connected to the socket 22 pass through a passage 62 and/or aperture 64 defined by the tool 10 such that the second ends 32 of the connector wires are external to the tool 10 in use, and the connector wires 28 may move freely relative to the tool 10 in use such that movement of the connector wires 28 is not impeded by rotation or application of the tool 10 relative to the socket 22, and the connector wires 28 are thereby protected from stress or other damage during installation and/or removal of the socket 22 relative to the housing 14.

The method may include operatively connecting a driver 44 to the driving end 46 of the tool 10, and applying the axial force 92 and the rotating force 90 to the driving end 46 of the tool 10 using the driver 44. The method may include removing and replacing the lamp bulb 20 prior to reinstalling the socket assembly 18 into the lamp housing 14, as described previously. By way of example, the lamp socket assembly 18 may be configured as a head lamp socket assembly, a tail lamp socket assembly, a turn indicator lamp socket assembly, a license plate lamp socket assembly, or other lamp socket assembly 18 configured for use in a vehicle 100.

The examples shown in FIGS. 1-5 of a lamp socket assembly tool 10 are not intended to be limiting. The term vehicle, as used herein, is not limited to an automobile and includes vehicles encompassed by the automotive, truck, rail, mass-transit, marine, aviation, aerospace, etc. industries. The terms lamp assembly, lamp, bulb, socket, housing, lens, etc. are not limited to those terms as referred to relative to a vehicle application or to any particular lamp application in a vehicle. Other configurations and applications of the tool 10 are possible, including configuration and use of the tool 10 to assemble a lamp socket 22, which may be a non-vehicle lamp socket, to a lamp housing 14 and/or housing opening 80 defined by a non-vehicle lamp assembly 12. The non-vehicle lamp assembly 12 may be incorporated into a machine, an appliance, or other structure incorporating a light source from a socket assembly for illumination. The tool 10 may be configured for use with a lamp assembly 12 which is positioned or configured such that access to the housing opening 80 and/or the insertion force and/or the locking torque (rotating force) limits manual installation of the lamp socket assembly 18 to the lamp housing 14. The driving end 46 may include an integral driver 44 or a detachable driver 44 selectively attachable to a driven interface 70, where the driver 44 and/or the driven interface 70 may be a standard or a non-standard configuration.

The detailed description and the drawings or figures are supportive and descriptive of the invention, but the scope of the invention is defined solely by the claims. While some of the best modes and other embodiments for carrying out the claimed invention have been described in detail, various alternative designs and embodiments exist for practicing the invention defined in the appended claims.

The invention claimed is:

1. A lamp socket assembly tool comprising:

an engaging end defining a non-cylindrical recess configured to engage a connector portion of a lamp socket;

a driving end operatively connected to the engaging end and configured to receive and transmit an axial force and a rotating force to the engaging end;

a passage;

an aperture defined by the passage;

wherein the passage and the aperture are in communication with the recess;

an engaging interface defined by the engaging end and configured as one of a step and a shoulder; and wherein the engaging interface is disposed between the recess and the passage.

2. The tool of claim 1, wherein the non-cylindrical recess defines an interface portion shaped to substantially conform to the connector portion of a standard ECE (United National Economic Commission for Europe) type lamp socket.

3. The tool of claim 1, wherein the non-cylindrical recess defines opposing flat engaging interface surfaces.

4. The tool of claim 1, wherein the non-cylindrical recess defines an interface portion shaped to substantially conform to one of an ECE H9 type lamp socket and an ECE H11 type lamp socket.

5. The tool of claim 1, wherein the tool is a first tool, the engaging end is a first engaging end, the non-cylindrical recess is a first non-cylindrical recess, and the connector portion is a first connector portion of a first type of lamp socket; and further comprising:

a second tool having a second engaging end defining a second non-cylindrical recess configured to engage a second connector portion of a second type of lamp socket; and wherein the first engaging end is not interchangeable with the second engaging end to engage the second type of lamp socket.

6. The tool of claim 1, further comprising:

a driver operatively connected to the driving end and configured to transmit the axial force and the rotating force to the driving end;

wherein the driver includes a plurality of radially extending gripping features.

7. A lamp socket assembly tool comprising:

an engaging end defining a non-cylindrical recess configured to engage a connector portion of a lamp socket;

a driving end operatively connected to the engaging end and configured to receive and transmit an axial force and a rotating force to the engaging end;

a driver configured to be removably connected to the tool;

the driving end including a driven interface configured to receive the driver; and wherein the driver is configured to transmit the axial force and the rotating force to the driving end through the driven interface.

8. The tool of claim 7, wherein:

the driven interface defines a polygonal surface; and the driver is configured to be in operative contact with the polygonal surface when the driver is selectively connected to the driven interface.

9. The tool of claim 7, wherein the non-cylindrical recess defines an interface portion shaped to substantially conform to the connector portion of a standard ECE (United National Economic Commission for Europe) type lamp socket.

10. The tool of claim 7, wherein the non-cylindrical recess defines an interface portion shaped to substantially conform to one of an ECE H9 type lamp socket and an ECE H11 type lamp socket.

11. The tool of claim 7, wherein the non-cylindrical recess defines opposing flat engaging interface surfaces.

12. The tool of claim 7, wherein the tool is a first tool, the engaging end is a first engaging end, the non-cylindrical recess is a first non-cylindrical recess, and the connector portion is a first connector portion of a first type of lamp socket; and further comprising:

a second tool having a second engaging end defining a second non-cylindrical recess configured to engage a second connector portion of a second type of lamp socket; and wherein the first engaging end is not interchangeable with the second engaging end to engage the second type of lamp socket.

13. A lamp socket assembly tool comprising:

an engaging end defining a non-cylindrical recess configured to engage a connector portion of a lamp socket;

a driving end operatively connected to the engaging end and configured to receive and transmit an axial force and a rotating force to the engaging end;

wherein the driving end includes:

a first driven interface including an opening defined by the driving end and configured to receive a first driver; and a second driven interface defined by an external surface of the driving end and configured to receive a second driver.

14. The tool of claim 13, wherein the non-cylindrical recess defines an interface portion shaped to substantially conform to the connector portion of a standard ECE (United National Economic Commission for Europe) type lamp socket.

15. The tool of claim 13, wherein the non-cylindrical recess defines an interface portion shaped to substantially conform to one of an ECE H9 type lamp socket and an ECE H11 type lamp socket.

16. The tool of claim 13, wherein the non-cylindrical recess defines opposing flat engaging interface surfaces.

17. The tool of claim 13, further comprising:

a driver operatively connected to the driving end and configured to transmit the axial force and the rotating force to the driving end; and wherein the driver includes a plurality of radially extending gripping features.

18. The tool of claim 13, wherein the tool is a first tool, the engaging end is a first engaging end, the non-cylindrical recess is a first non-cylindrical recess, and the connector portion is a first connector portion of a first type of lamp socket; and further comprising:

a second tool having a second engaging end defining a second non-cylindrical recess configured to engage a second connector portion of a second type of lamp socket; and wherein the first engaging end is not interchangeable with the second engaging end to engage the second type of lamp socket.

* * * * *